(12) United States Patent
Pietambaram et al.

(10) Patent No.: US 12,272,484 B2
(45) Date of Patent: Apr. 8, 2025

(54) CORELESS ELECTRONIC SUBSTRATES HAVING EMBEDDED INDUCTORS

(71) Applicant: Intel Corporation, Santa Clara, CA (US)

(72) Inventors: Srinivas Pietambaram, Chandler, AZ (US); Pooya Tadayon, Portland, OR (US); Kristof Darmawikarta, Chandler, AZ (US); Tarek Ibrahim, Mesa, AZ (US); Prithwish Chatterjee, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 858 days.

(21) Appl. No.: 17/192,187

(22) Filed: Mar. 4, 2021

(65) Prior Publication Data
US 2022/0285079 A1    Sep. 8, 2022

(51) Int. Cl.
| H01F 27/28 | (2006.01) |
| H01F 1/04 | (2006.01) |
| H01F 27/40 | (2006.01) |
| H05K 1/16 | (2006.01) |

(52) U.S. Cl.
CPC ........... H01F 27/2804 (2013.01); H01F 1/04 (2013.01); H01F 27/40 (2013.01); H05K 1/165 (2013.01)

(58) Field of Classification Search
CPC ......... H01F 27/2804; H01F 1/04; H01F 27/40
USPC ........................................................ 336/200
See application file for complete search history.

(56) References Cited

U.S. PATENT DOCUMENTS

| 6,831,534 B2 * | 12/2004 | Rodriguez | H01H 71/123 335/132 |
| 7,307,503 B2 * | 12/2007 | Kaji | H01F 41/041 336/200 |
| 9,336,938 B2 * | 5/2016 | Fujii | H01F 41/041 |
| 10,790,792 B2 * | 9/2020 | Nakaiso | H05K 3/4605 |
| 2007/0247268 A1 * | 10/2007 | Oya | H01F 41/046 336/200 |

(Continued)

FOREIGN PATENT DOCUMENTS

| JP | 2006237506 | 9/2006 |
| JP | 2007266114 A * | 10/2007 |

(Continued)

OTHER PUBLICATIONS

International Search Report and Written Opinion for PCT Application No. PCT/US2022/014885, dated May 23, 2022.

(Continued)

*Primary Examiner* — Shawki S Ismail
*Assistant Examiner* — Joselito S. Baisa
(74) *Attorney, Agent, or Firm* — Essential Patents Group, LLP

(57) ABSTRACT

An inductor can be formed in a coreless electronic substrate from magnetic materials and/or fabrication processes that do not result in the magnetic materials leaching into plating and/or etching solutions/chemistries, and results in a unique inductor structure. This may be achieved by forming the inductors from magnetic ferrites. The formation of the electronic substrates may also include process sequences that prevent exposure of the magnetic ferrites to the plating and/or etching solutions/chemistries.

21 Claims, 15 Drawing Sheets

(56) References Cited

U.S. PATENT DOCUMENTS

| | | | |
|---|---|---|---|
| 2010/0109123 A1* | 5/2010 | Strzalkowski | H01F 17/0013 |
| | | | 336/200 |
| 2018/0138126 A1* | 5/2018 | Chen | H01L 23/50 |
| 2018/0269708 A1* | 9/2018 | Yeh | H02J 50/005 |
| 2019/0295967 A1* | 9/2019 | Darmawikarta | H01L 24/16 |
| 2020/0066634 A1 | 2/2020 | Do et al. | |

FOREIGN PATENT DOCUMENTS

| | | | |
|---|---|---|---|
| JP | 2008053675 A * | 3/2008 | |
| JP | 2012033622 A * | 2/2012 | |
| JP | 5078340 B2 * | 11/2012 | |
| JP | 2014027251 | 2/2014 | |
| JP | 2014120566 | 6/2014 | |
| JP | 2016134424 | 7/2016 | |
| WO | WO-2010097387 A1 * | 9/2010 | |
| WO | WO-2019150936 A1 * | 8/2019 | |

OTHER PUBLICATIONS

International Preliminary Report on Patentability from PCT/US2022/014885 notified Sep. 14, 2023, 6 pgs.

Matsushita, et al., "Ni—Zn—Co Ferrite Films Prepared at 90° C. Having $\mu''$= 30 at 3GHz", IEEE Transactions on Magnetics, vol. 38, No. 5, Sep. 2002.

* cited by examiner

CORELESS ELECTRONIC SUBSTRATES HAVING EMBEDDED INDUCTORS

TECHNICAL FIELD

Embodiments of the present description generally relate to the field of electronic substrates and, more particularly, to the integration of magnetic materials into coreless electronic substrates to form inductors.

BACKGROUND

The integrated circuit industry is continually striving to produce ever faster and smaller integrated circuit devices for use in various server and mobile electronic products, including but not limited to, computer server products and portable products, such as wearable integrated circuit systems, portable computers, electronic tablets, cellular phones, digital cameras, and the like. However, achieving these goals increases power delivery demands for the integrated circuit devices.

These power delivery demands are supported by inductors, which are used to stabilize electrical current in the integrated circuit devices. As will be understood to those skilled in the art, inductors are passive electrical components that store energy in a magnetic field generated by magnetic materials within the inductors, and are generally stand-alone components that are electrically attached to the integrated circuit devices. In order to produce faster and smaller integrated circuit devices, these inductors should have high inductance density and high Q factor to improve power conversion. These concerns are particularly relevant to integrated circuit devices with Fully Integrated Voltage Regulators (FIVR), as will be understood to those skilled in the art.

Current solutions include air core inductors, surface mounted inductor modules, inductor modules embedded in the electronic substrate, on-silicon magnetic core inductors, and co-axial inductor architectures, where in the substrate core has plated through holes that are filled with high permeability magnetic materials to achieve high power conversion efficiency, as will be known to those skilled in the art. Although these solutions have demonstrated improvements, each of these solutions require relatively thick or cored electronic substrates and/or result in a Z-height that would be too high for some applications, and they are not amenable for use in coreless electronic substrates.

Thus, integrated planar inductors within electronic substrates may be the only option to provide an effective solution for power delivery, particularly for fully integrated voltage regulators. As the real estate available for the inductors in these electronic substrates is very limited, new architectures to ensure that inductor coil structures are completely encapsulated as well as using materials and manufacturing techniques that result in high quality inductors with high inductance density are needed. One solution that may be a more amenable option for coreless packages is the use of magnetic resins to form the inductors. Magnetic resins consist of magnetic fillers embedded in an organic dielectric epoxy matrix, which can be made into laminate films or printable pastes. However, these magnetic resins may only provide limited improvement in magnetic properties, such as permeability. Also, these magnetic resins may be incompatible with standard fabrication processes, such as wet plating and etching (e.g., de-smear, electroless copper seed formation, seed etching, metal roughening baths, and the like), as the magnetic fillers in the magnetic resins can leach into the plating and/or etching solutions/chemistries. The leaching of the magnetic fillers in the magnetic resins, even at a low number of parts per million, into the plating and/or etching solutions/chemistries may have a detrimental impact on the quality, process stability, and useful life of the solutions/chemistries. As a result, the formulation of the magnetic resin may have to be tailored to suit the standard fabrication processes, which may be detrimental to the magnetic properties of the magnetic resins.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
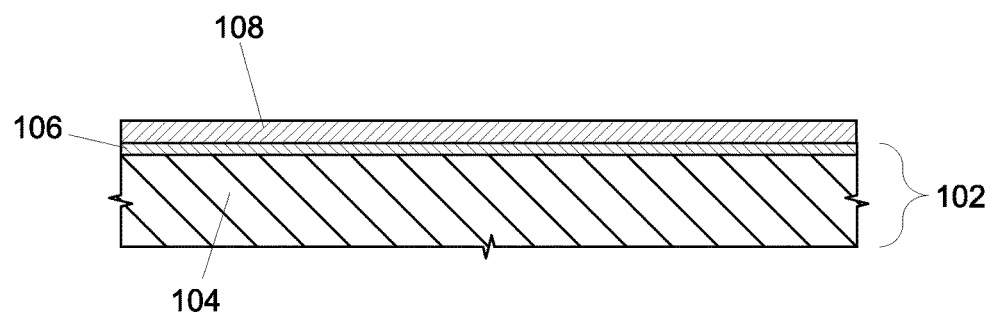
FIGS. 1-12 are side cross-sectional views of a process for the fabrication of an inductor in an electronic substrate, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description relate to inductors for use in integrated circuit devices and to the formation of such inductors within coreless electronic substrates, wherein the magnetic material used in the inductor and/or the fabrication process does not result in the magnetic material leaching into plating and/or etching solutions/chemistries. This may be achieved by forming the inductors from magnetic ferrites. The formation of the electronic substrates may also include process sequences that prevent exposure of the magnetic ferrites to the plating and/or etching solutions/chemistries. The embodiments of the present description can allow for the fabrication of a coreless substrate with an integrated high inductance density and low-loss planar magnetic inductors. These inductors are completely contained within the coreless electronic substrate and add no Z-height penalty. These coreless substrates can be manufactured with existing manufacturing processes with little or no impact to the chemistry or equipment.

The term "high-permeability", for the purposes of the present description, is defined to mean a relative permeability (ratio of permeability (measure of magnetization that a material obtains in response to an applied magnetic field) to the permeability of free space) of a magnetic material being greater than about 100 over a frequency range of a magnetic field of between about 10 to 200 megahertz.

FIGS. 1-12 illustrate a process for fabricating an inductor in an electronic substrate 100 (see FIG. 12), according to an embodiment of the present description. FIG. 1 illustrates a carrier substrate 102 having a conductive material layer 108 formed thereon. The carrier substrate 102 may comprise a substantially planar structure 104, which may be any appropriate substantially rigid material, including but not limited to, glass, ceramic, metal, and the like. An optional interface layer 106 may be a material that allows for the effective removal of the electronic substrate 100 (see FIG. 12) after the fabrication thereof and/or may act as a seed or nucleation site for plating the conductive material layer 108. In an embodiment of the present description, the planar structure 104 may be a peelable core, which consists of layer of metal foils, such as copper foils, with the interface layer 106 that can be separated, for example, by mechanical means. In one embodiment, the interface layer 106 may comprise a copper foil or a seed layer. In a further embodiment, the conductive material layer 108 may be made of any appropriate conductive material, including but not limited to, metals, such as copper, silver, nickel, gold, and aluminum, alloys thereof, and the like. The conductive material layer 108 may be formed by any known process, including but not limited to plating. Plating processes, such as electroplating and electroless plating, are well known in the art and, for purposes of clarity and conciseness, will not be discussed herein.

Figure 2:
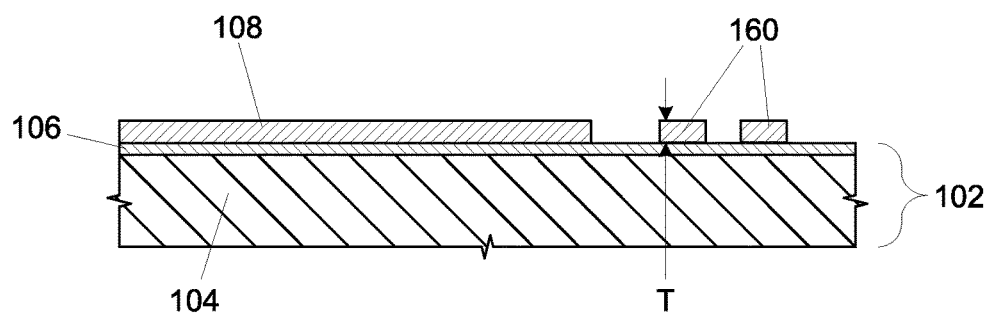

As shown in FIG. 2, an inductor coil 160 may be formed from the conductive material layer 108. In one embodiment of the present description, the inductor coil 160 may be formed by subtractive etching of the conductive material layer 108. The subtractive etching process is well known in the art and, for purposes of clarity and conciseness, will not be discussed herein.

Figure 3:
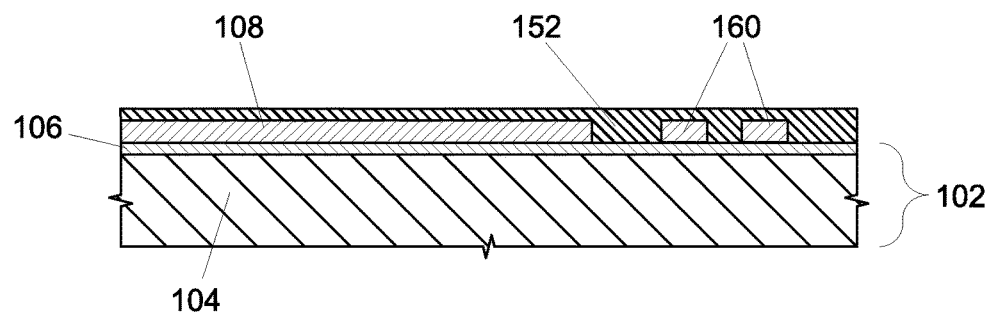

As shown in FIG. 3, a high-permeability magnetic ferrite material layer 152 may be formed over the conductive material layer 108 and the inductor coil 160. In one embodiment of the present description, the high-permeability magnetic ferrite material layer 152 may have a permeability of about 120 over a frequency range of a magnetic field of between about 50 to 120 megahertz. The high-permeability magnetic ferrite material layer 152 may comprise a magnetized ceramic material formed from iron oxide $Fe_2O_3$ in conjunction with one or more additional metallic elements, including, but not limited to, barium, manganese, nickel, cobalt, and zinc. In one embodiment of the present description, the high-permeability magnetic ferrite material layer 152 may comprise a nickel/zinc ferrite (i.e., containing iron oxide, nickel, and zinc). In another embodiment of the present description, the high-permeability magnetic ferrite material layer 152 may comprise a nickel/zinc/cobalt ferrite (i.e., containing iron oxide, nickel, zinc, and cobalt). Both nickel/zinc ferrite and nickel/zinc/cobalt ferrite may exhibit permeabilities in excess of 100 (as previously discussed), which is about an order of magnitude higher than the permeability that can be achieved with magnetic resins. Such materials used in the formation of the high-permeability magnetic ferrite material layer 152 are substantially non-conducting, which can result in reduced eddy current losses. Furthermore, high-permeability magnetic ferrite material layer 152 may be formed at relatively low temperatures and may be substantially inert to various plating and/or etching solutions/chemistries, which substantially eliminates issues seen with magnetic resins, such as leaching and contaminating the plating and/or etching solutions/chemistries, as previously described. Thus, the formation of the high-permeability magnetic ferrite material layer 152 may be easily integrated into existing coreless substrate manufacturing processes.

The high-permeability magnetic ferrite material layer 152 may be formed by any process known in the art, including, but not limited to, spin coating, spray coating, sputtering, deposition, growth, or combinations thereof. In one embodiment, the high-permeability magnetic ferrite material layer 152 may be formed by a spin-spray process. The spin-spray process is a ferrite plating process which involves the direct deposition of ferrite film on a spinning substrate from aqueous solution at temperatures of less than 100 degrees Celsius. The spin-spray process can form the high-permeability magnetic ferrite material layer 152 at relatively low temperatures that are compatible with substrate processing as compared to traditional plating which needs a high temperature post-deposition anneal for realizing high permeabilities. In one embodiment, the high-permeability magnetic ferrite material layer 152 may have a thickness of between about 2 and 40 microns.

Figure 4:
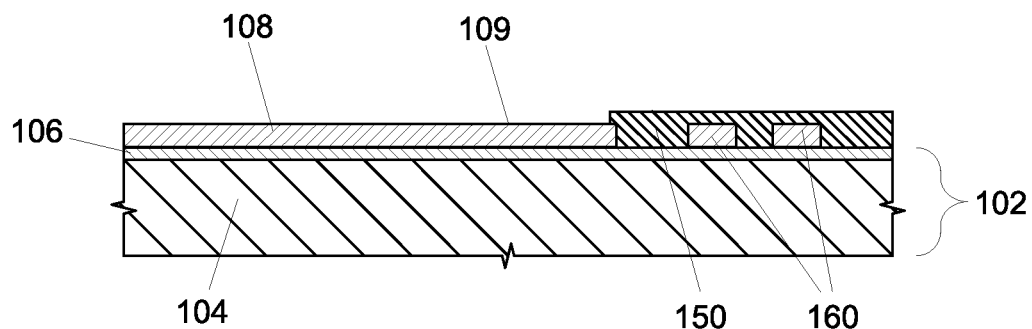

As shown in FIG. 4, a portion of the high-permeability magnetic ferrite material layer 152 (see FIG. 3) on the conductive material layer 108 may be removed to form a first high-permeability magnetic ferrite element 150. In one embodiment of the present description, the first high-permeability magnetic ferrite material layer 150 may have a permeability of about 120 over a frequency range of a magnetic field of between about 50 to 120 megahertz. In an embodiment of the present description, the inductor coil 160 may be at least partially embedded in the first high-permeability magnetic ferrite element 150. In one embodiment of the present description, the portion of the high-permeability magnetic ferrite material layer 152 (see FIG. 3) on the conductive material layer 108 may be removed by laser ablation. The conductive material layer 108 may be utilized as a laser ablation stop layer, thus a portion of the first high-permeability magnetic ferrite element 150 may reside on an upper surface 109 of the conductive material layer 108, as well as abutting the conductive material layer 108.

Figure 5:
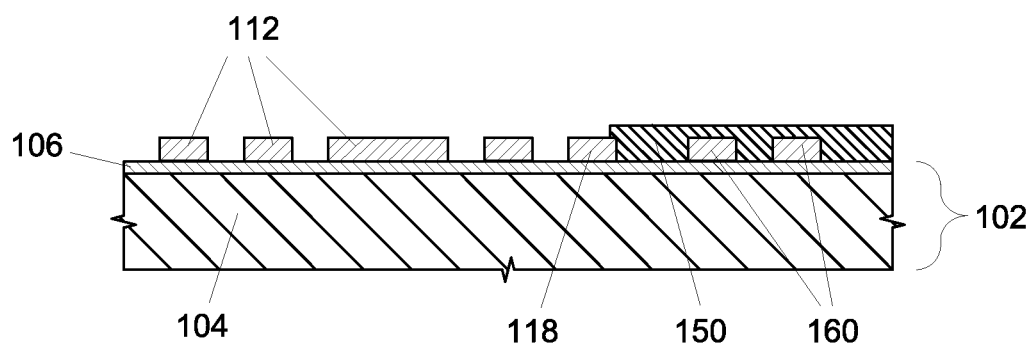

As shown in FIG. 5, at least one first level conductive trace 112 and a frame structure 118 may be formed from the conductive material layer 108. It is understood that the term "conductive trace" includes conductive traces for forming electrical routes, via pads for landing conductive vias, and bond pads for forming conductive interconnects, as will be discussed. In one embodiment of the present description, the inductor coil 160, the first level conductive traces 112, and the frame structure 118 may be formed by selective etching of the conductive material layer 108. The frame structure 118 is a remnant of using the conductive material layer 108 as a laser ablation stop layer. As a portion of the first high-permeability magnetic ferrite element 150 may reside on the upper surface 109 of the conductive material layer 108, it may act as a mask during the selective etch to form the first level conductive traces 112 and, thus, leave the frame structure 118 as a remnant of the process. In one embodiment, the frame structure 118 may be inactive, wherein is not a part of any conductive route, as will be understood to those skilled in the art.

Figure 6:
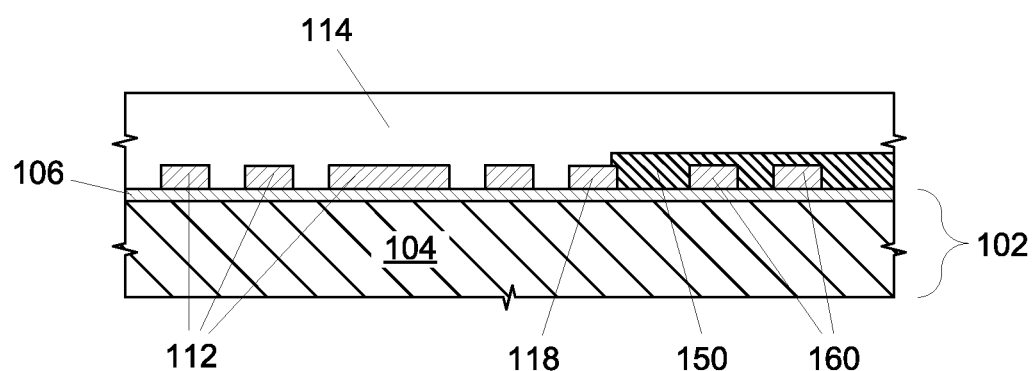

As shown in FIG. 6, the first level dielectric material layer 114 may be formed on the first level conductive traces 112 and the first high-permeability magnetic ferrite element 150. The first level dielectric material layer 114 may comprise any appropriate dielectric material, including, but not limited to, bismaleimide triazine resin, fire retardant grade 4 material, polyimide material, silica filled epoxy material, glass reinforced epoxy material, low temperature co-fired ceramic materials, and the like, as well as low-k and ultra low-k dielectrics (dielectric constants less than about 3.6), including, but not limited to, carbon doped dielectrics, fluorine doped dielectrics, porous dielectrics, organic polymeric dielectrics, fluoropolymers, and the like. The first level dielectric material layer 114 may be formed by any appropriate processes, as known in the art. In one embodiment of the present description, the first level dielectric material layer 114 may be formed by lamination.

Figure 7:
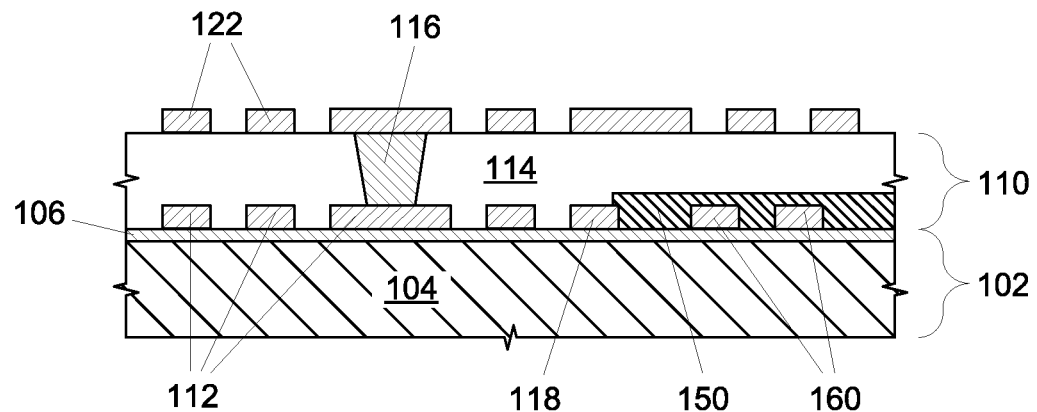
Figure 24:
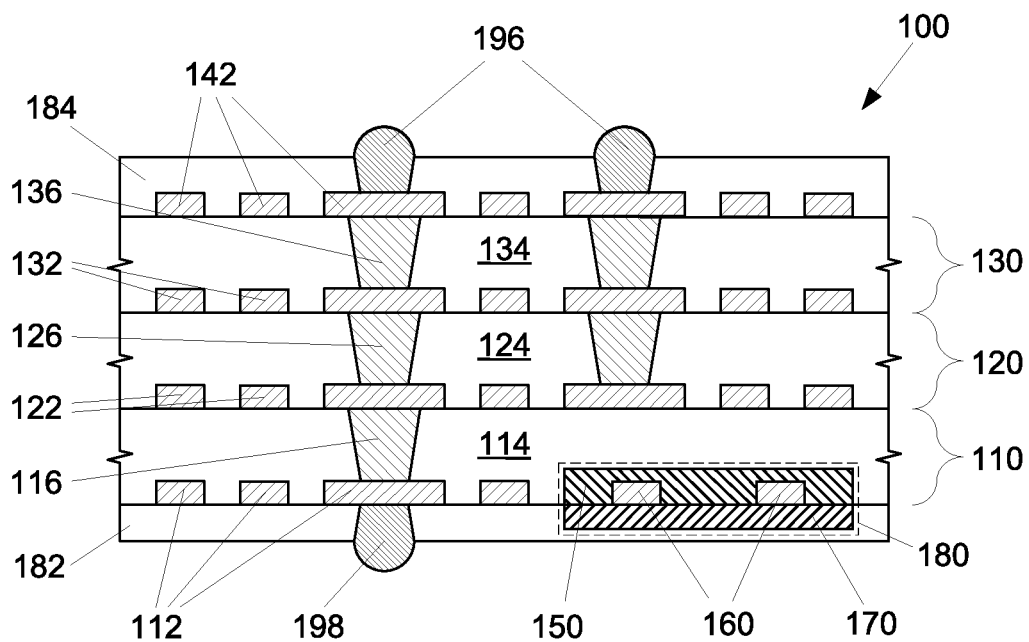

As shown in FIG. 7, at least one first level conductive via 116 may be formed to extend through the first level dielectric material layer 114, wherein the at least one first level conductive via 116 is in contact with the at least one first level conductive trace 112, to form a first level 110 of the electronic substrate 100 (see FIG. 24). As further shown in FIG. 7, the at least one second level conductive trace 122 may be formed on the first level dielectric material layer 114, wherein the at least one second level conductive trace 122 is in contact with the at least one first level conductive via 116. The first level conductive via(s) 116 and the second level conductive trace(s) 122 may be formed by any known process and material. In one embodiment of the present description, the first level conductive via 116 and the second level conductive trace 122 may be formed with a semi-additive process with photolithography. In a further embodiment of the present description, the second level conductive trace(s) 122 and the first level conductive via(s) 116 may be made of any appropriate conductive material, including but not limited to, metals, such as copper, silver, nickel, gold, aluminum, alloys thereof, and the like.

Figure 8:
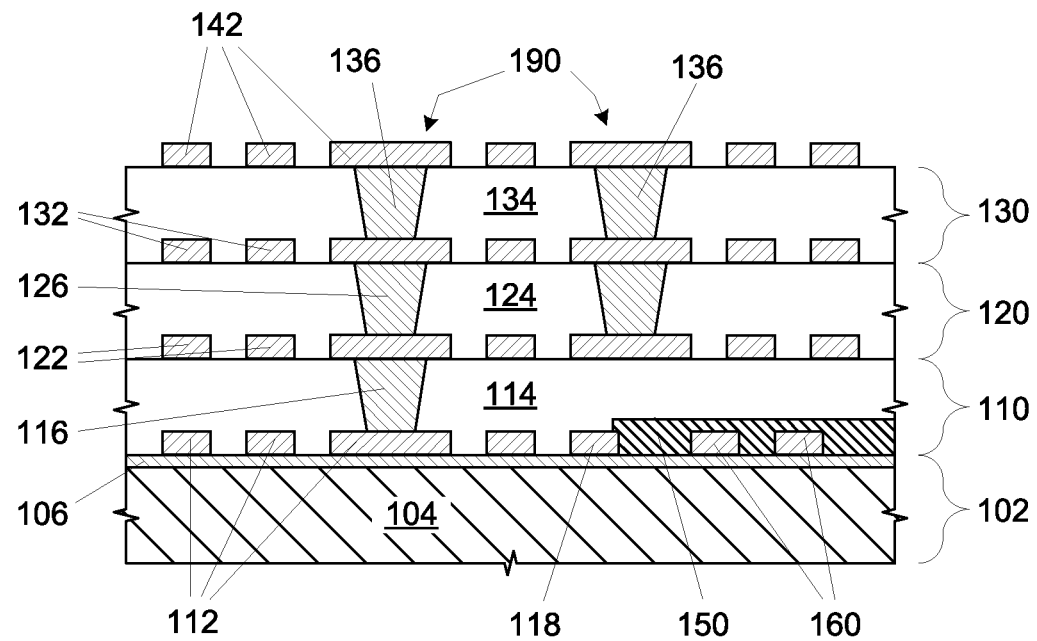

It is understood that any number of levels may be built up on the first level 110 using the same processes and materials as described with regard to the first level 110. For example, FIG. 8 illustrates two additional levels on the first level 110, i.e., a second level 120 comprising the second level conductive traces 122, a second level dielectric material layer 124, and at least one second level conductive via 126 extending through the second level dielectric material layer 124 to contact at least one second level conductive trace 122; a third level 130 comprising at least one third level conductive trace 132, wherein the at least one third level conductive trace 132 is in contact with the at least one second level conductive via 126, a third level dielectric material layer 134, and at least one third level conductive via 136 extending through the third level dielectric material layer 134 to contact at least one third level conductive trace 132; and at least one fourth level conductive trace 142, wherein the at least one fourth level conductive trace 142 is in contact with the at least one third level conductive via 136. For the sake of clarity and conciseness, only a few conductive traces 112, 122, 132, 142 and a few conductive vias 116, 126, 136 are illustrated and no fanning in or out is shown, as will be understood by those skilled in the art.

Figure 12:
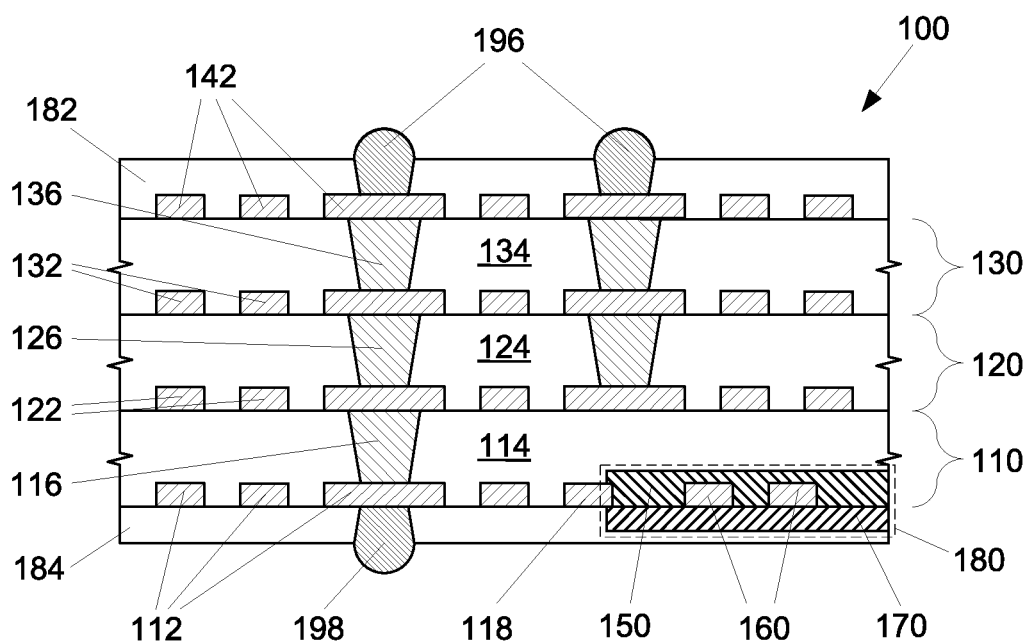
Figure 13:
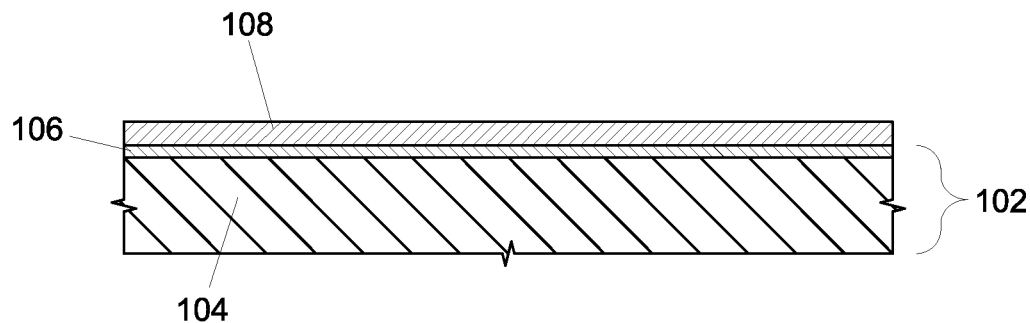
FIGS. 13-24 are side cross-sectional views of a process for the fabrication of an inductor in an electronic substrate, according to another embodiment of the present description.
Figure 14:
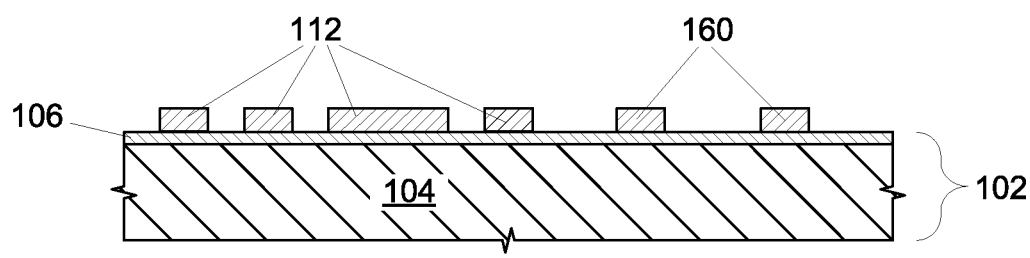
Figure 15:
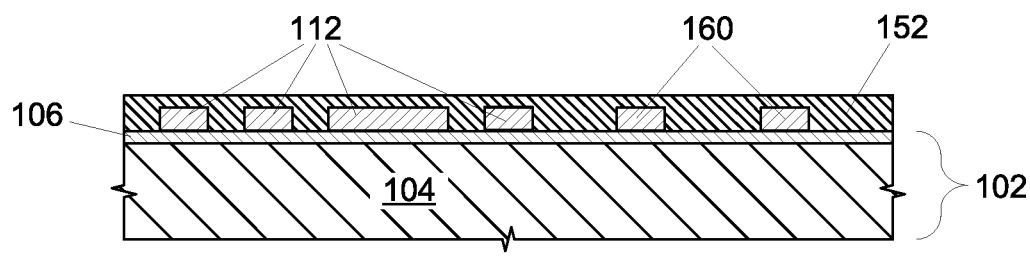
Figure 16:
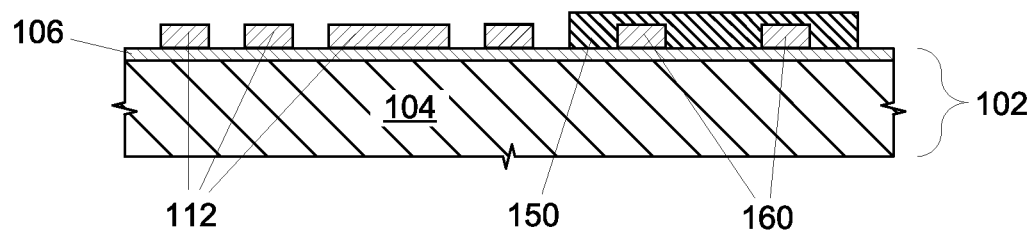
Figure 17:
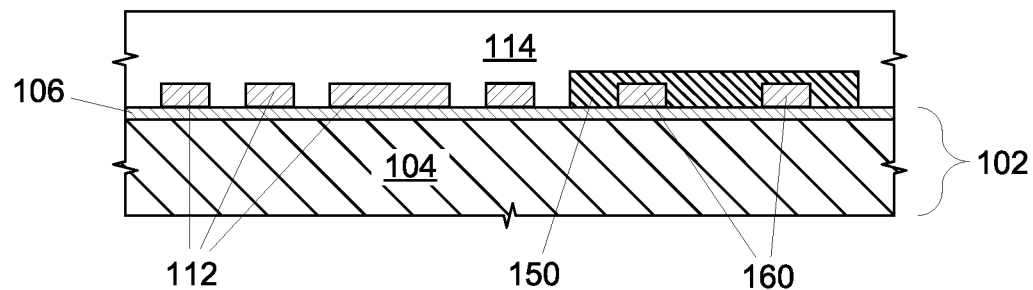
Figure 18:
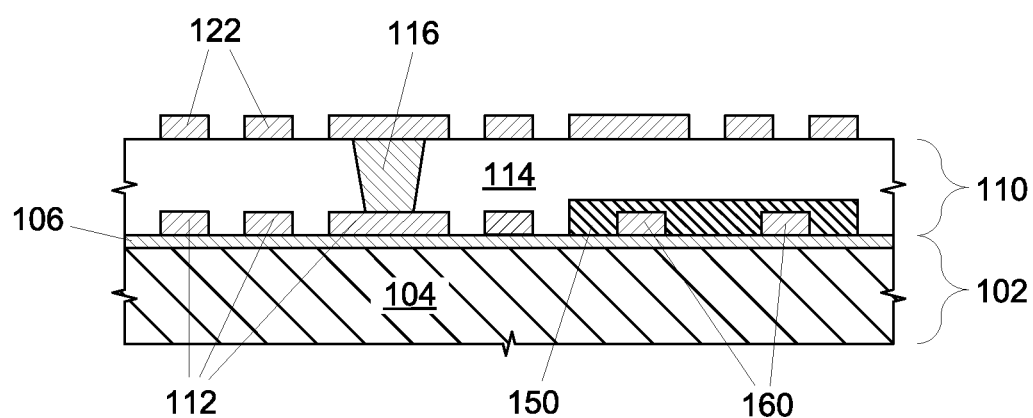
Figure 19:
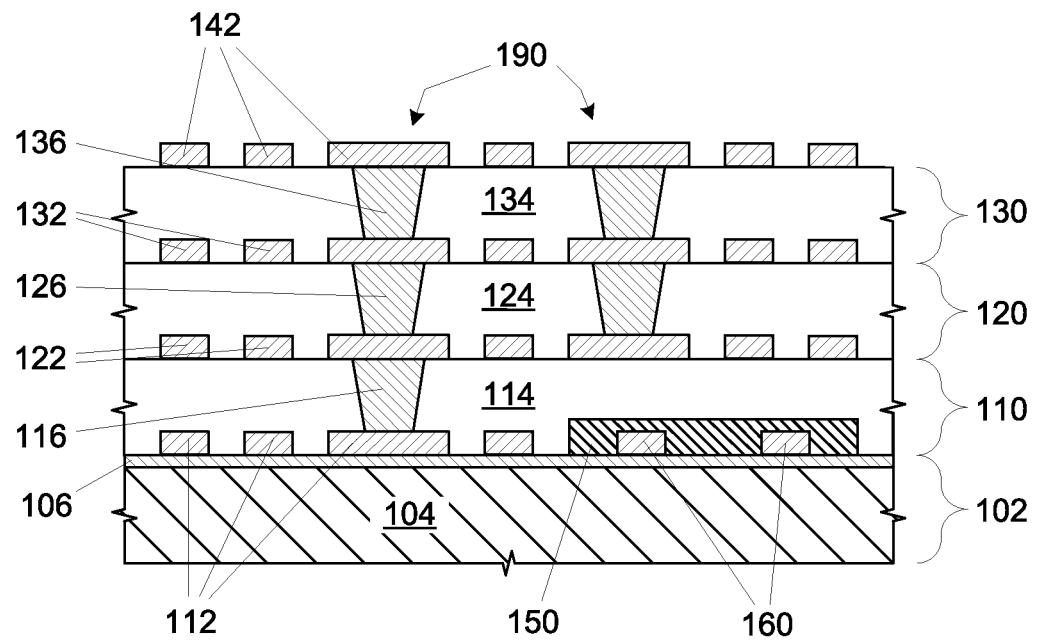
Figure 20:
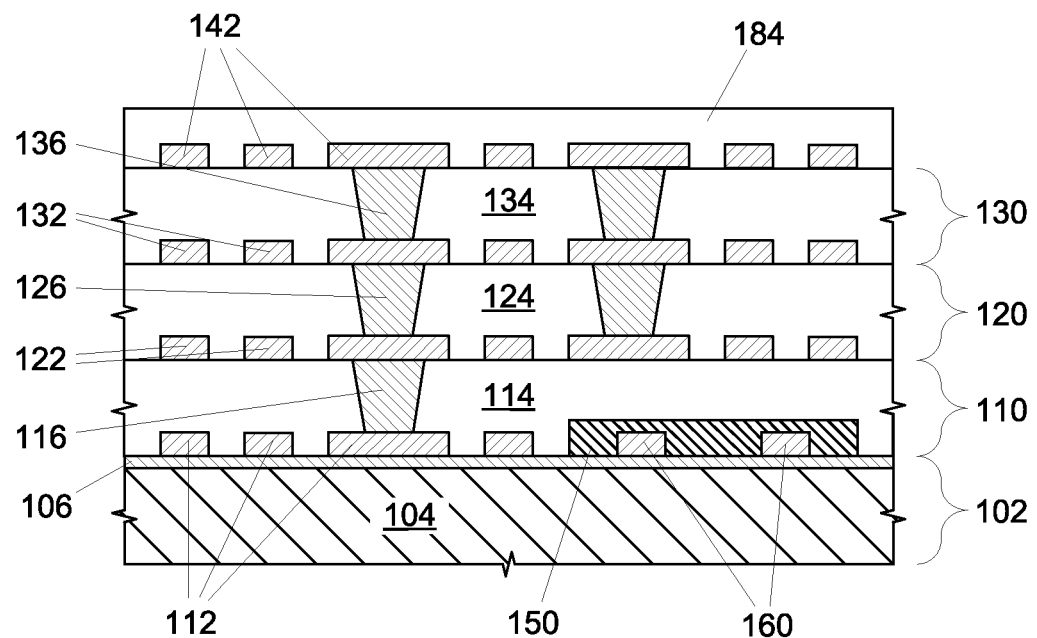
Figure 21:
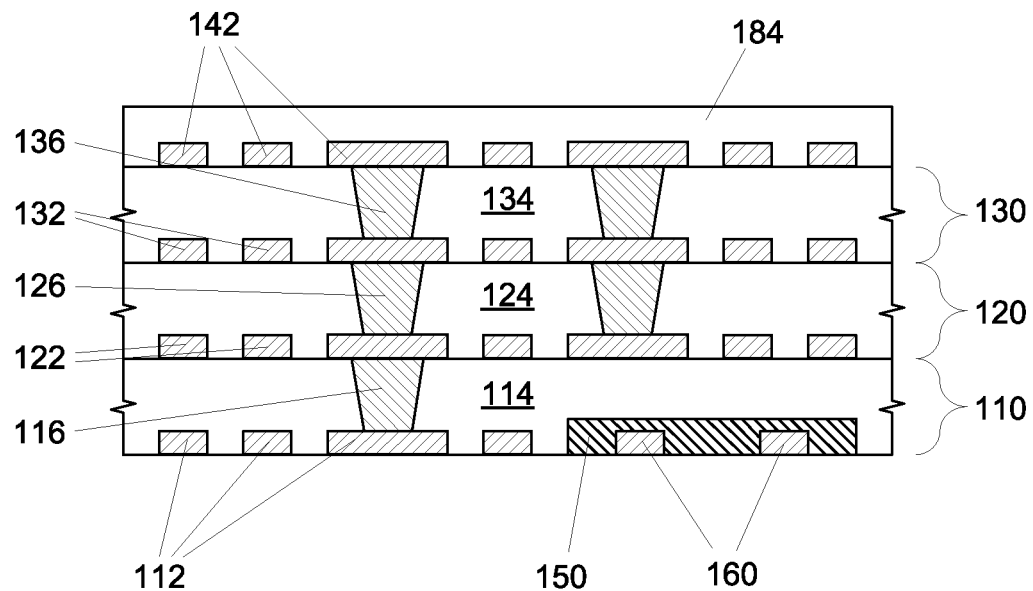
Figure 22:
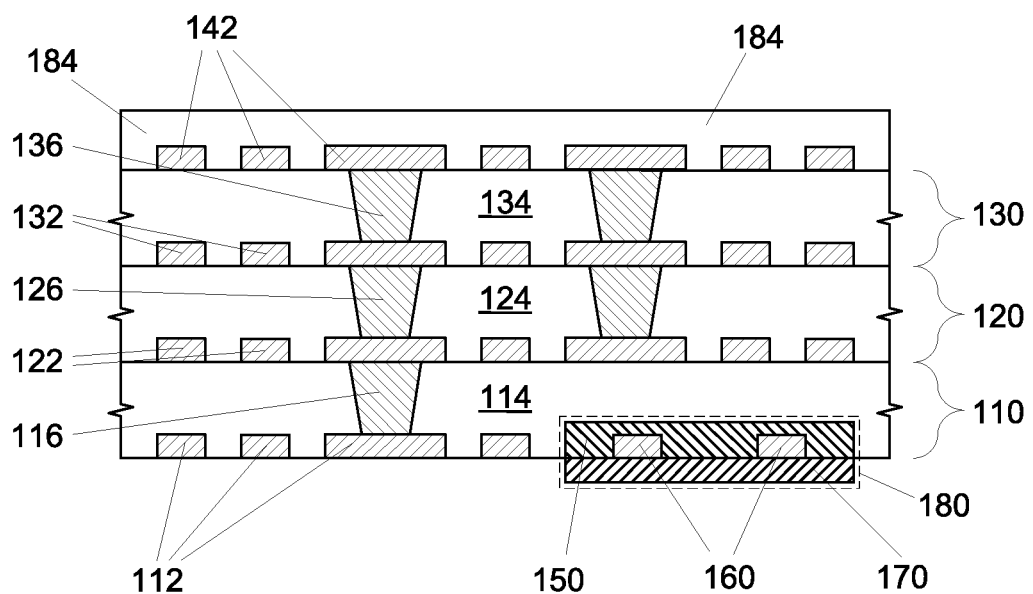
Figure 23:
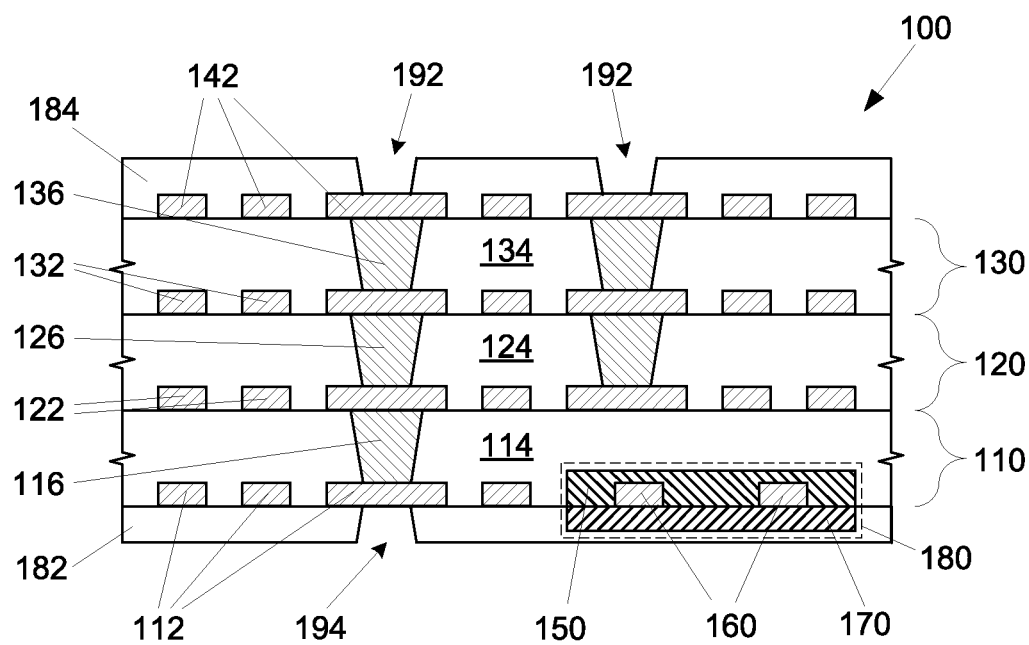

As will be understood by those skilled in the art, the conductive traces (e.g., the first level conductive traces 112, the second level conductive traces 122, the third level conductive traces 132, and the fourth level conductive traces 142) and the conductive vias (e.g., the first level conductive vias 116, the second level conductive vias 126, and the third level conductive vias 136) form conductive routes 190 or "metallization" extending through the electronic substrate 100 (see FIG. 12).

Figure 9:
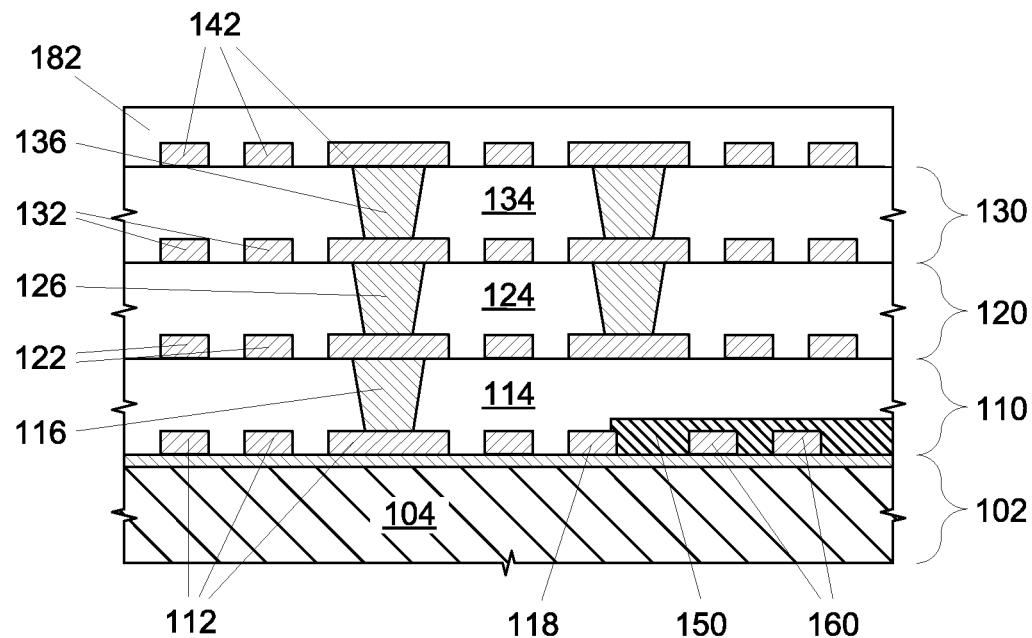

As shown in FIG. 9, a die-side solder resist material layer 182 may be formed on the fourth level conductive trace 142 and the third level dielectric material layer 134. The die-side solder resist material layer 182 may be any known solder resist material, including, but not limited to polymer materials.

Figure 10:
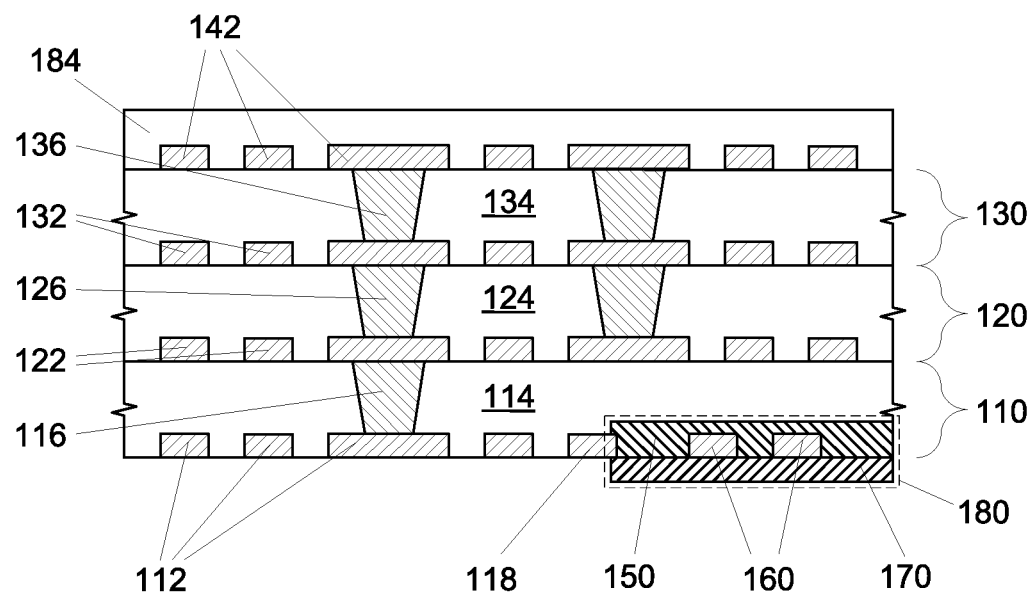

As shown in FIG. 10, the carrier substrate 102 may be removed and a second high-permeability magnetic ferrite element 170 may be formed on the first high-permeability magnetic ferrite element 150. In one embodiment of the present description, the second high-permeability magnetic ferrite element 170 may have a permeability of about 120 over a frequency range of a magnetic field of between about 50 to 120 megahertz. In an embodiment of the present description, an inductor 180, shown within a dashed box, may be defined to include the first high-permeability magnetic ferrite element 150, the second high-permeability magnetic ferrite element 170, and the inductor coil 160. In an embodiment of the present description, the second high-permeability magnetic ferrite element 170 may abut the first high-permeability magnetic ferrite element 150. In a further embodiment, the first high-permeability magnetic ferrite element 150 and the second high-permeability magnetic ferrite element 170 may substantially encapsulate the inductor coil 160. As with the first high-permeability magnetic ferrite element 150, the second high-permeability magnetic ferrite element 170 may comprise a magnetized ceramic material formed from iron oxide $Fe_2O_3$ in conjunction with one or more additional metallic elements, including, but not limited to, barium, manganese, nickel, cobalt, and zinc. In one embodiment of the present description, the second high-permeability magnetic ferrite element 170 may comprise a nickel/zinc ferrite (i.e., containing iron oxide, nickel, and zinc). In another embodiment of the present description, the second high-permeability magnetic ferrite element 170 may comprise a nickel/zinc/cobalt ferrite (i.e., containing iron oxide, nickel, zinc, and cobalt). The second high-permeability magnetic ferrite element 170 may be formed in a similar manner to that of the first high-permeability magnetic ferrite element 150, as previously discussed.

Figure 11:
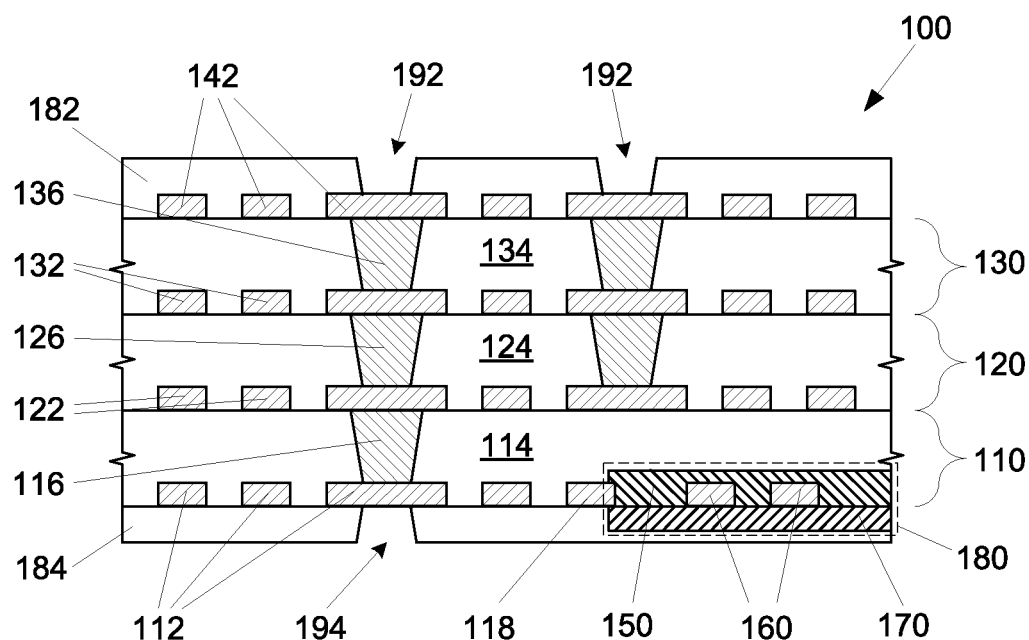

As shown in FIG. 11, a land-side solder resist material layer 184 may be formed on the second high-permeability magnetic ferrite element 170, the first level conductive traces 112, the frame structure 118, and the first level dielectric material layer 114. In one embodiment of the present description, the land-side solder resist material layer 184 may substantially encapsulate the second high-permeability magnetic ferrite element 170. In an embodiment of the present description, the land-side solder resist material layer 184 may be any known solder resist material, including, but not limited to polymer materials. As further shown in FIG. 11, at least one die-side opening 192 may be formed in the die-side solder resist material layer 182 to expose at least a portion of at least one fourth level conductive trace 142 and at least one land-side opening 194 may be formed in the land-side resist material layer 184 to expose at least portion of at least one first level conductive trace 112.

As shown in FIG. 12, at least one die-side solder interconnect 196 may be formed in the at least one die-side opening 162 (see FIG. 11) and at least one land-side solder interconnect 168 may be formed in the at least one land-side opening 164 (see FIG. 11) to form the electronic substrate 100. In one embodiment of the present description, a surface finish (not shown), such as a nickel/palladium/gold stack layer, may be formed on the exposed portions of the fourth level conductive trace(s) 142 prior to forming the die-side solder interconnects 166 and/or the land-side solder interconnects 168. In another embodiment of the present description, the die-side solder interconnects 166 and/or the land-side solder interconnects 168 may be micro ball bumps formed from tin, lead/tin alloys (for example, 63% tin/37% lead solder), and high tin content alloys (e.g., 90% or more tin—such as tin/bismuth, eutectic tin/silver, ternary tin/silver/copper, eutectic tin/copper, and similar alloys).

Although the embodiment of FIGS. 1-12 illustrates the formation of the electronic substrate 100 on a single side of the carrier substrate 102, it is understood that two electronic substrates could be formed on opposing sides of the carrier substrate 102. Furthermore, in an alternate embodiment of the present description, rather than forming the die-side solder resist material layer 152, as shown in FIG. 9, a protective film (not shown) may be used in its place. The protective film may be removed after the formation of the second high-permeability magnetic ferrite element 170, and the die-side solder resist material layer 182 and the land-side solder resist material layer 184 may be simultaneously formed, as will be understood to those skilled in the art.

Figure 25:
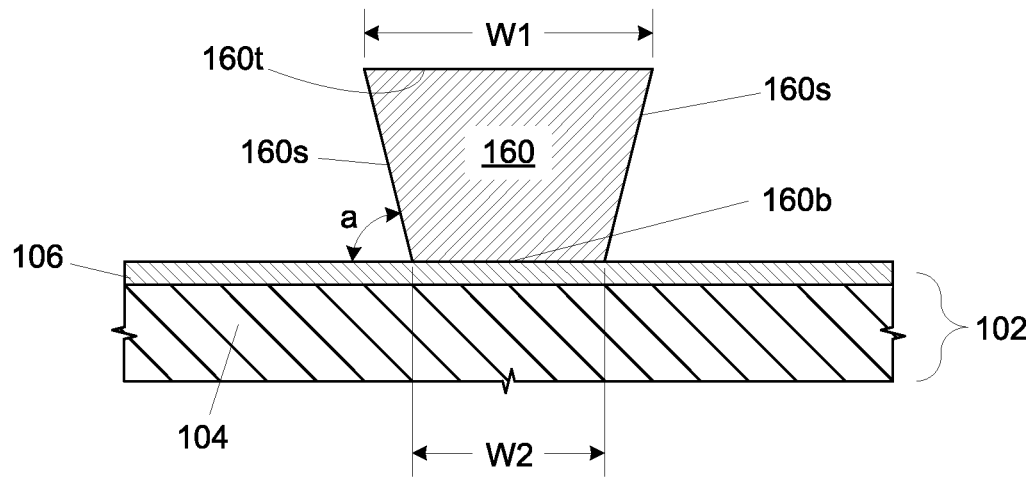
FIG. 25 is a side cross-sectional view of an inductor coil, according to an embodiment of the present description.
Figure 26:
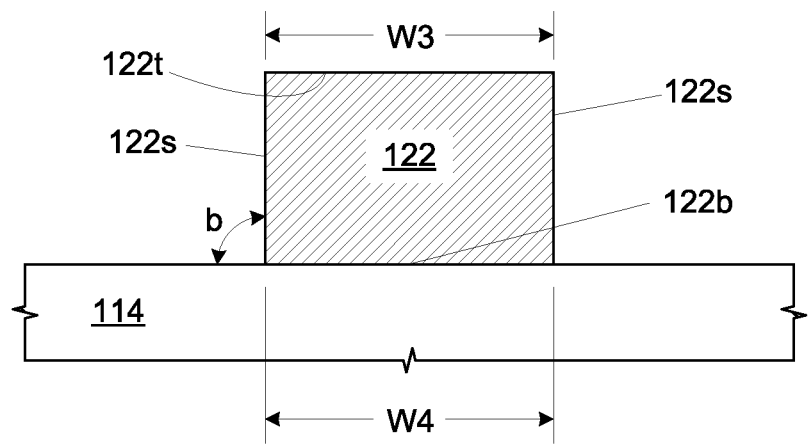
FIG. 26 is a side cross-sectional view of a conductive trace, according to an embodiment of the present description.

It will be noted that the inductor coil 160 and the first level conductive trace(s) 112 (and the frame structure 118 of the embodiment of FIGS. 1-12) in the first level 110 may be formed by a subtractive etching process. This subtractive etch process will result in a cross-sectional shape of the inductor coil 160 and the first level conductive trace(s) 112 (and the frame structure 118 of the embodiment of FIGS. 1-12) in the first level 110 that differs from the cross-sectional shape of the second level conductive trace(s) 122 of the second level 120 and the third level trace(s) 132 of the third level 130, when they are formed by a semi-additive process with photolithography. As shown in FIG. 25, the subtractive etch process may result in a width W1 of a top surface 160t of the inductor coil 160 that is greater than a width W2 of an opposing bottom surface 160b, which may result in at least one side 160s (extending between the top surface 160t and the bottom surface 160b) of the inductor coil 160 having an average angle "a" between the at least one side 160s and the carrier substrate 102 of about 45 and 80 degrees. It is understood that although the at least one side 160s of the inductor coil 160 is illustrated as planar or straight, it may be irregular or arcuate due to the nature of the subtractive etch process. As shown in FIG. 26, the semi-additive process with photolithography may result in a width W3 of a top surface 122t of the second level conductive trace 122 that is substantially the same as a width W4 of an opposing bottom surface 122b, which may result in at least one side 122s (extending between the top surface 122t and the bottom surface 122b) of the second level conductive trace 122 having an average angle "b" between the at least one side 122s and the carrier substrate 102 of about 85 and 95 degrees.

Figure 27:
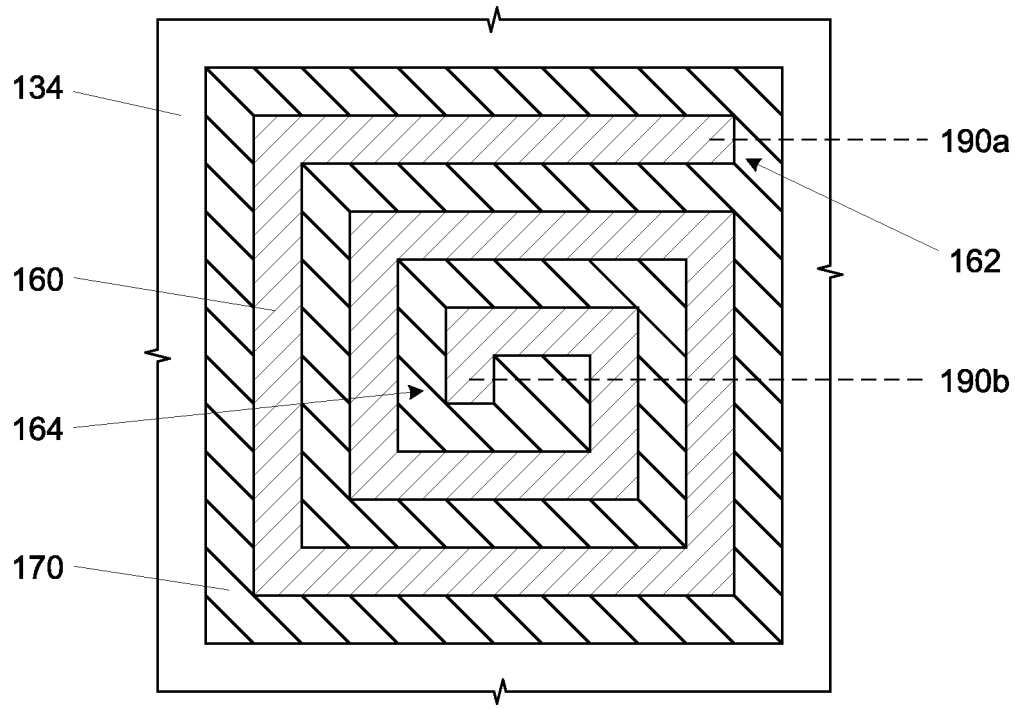
FIGS. 27-29 are top plan views of an inductor coil in an electronic substrate along line 27-27 of FIG. 24, according to various embodiments of the present description.
Figure 28:
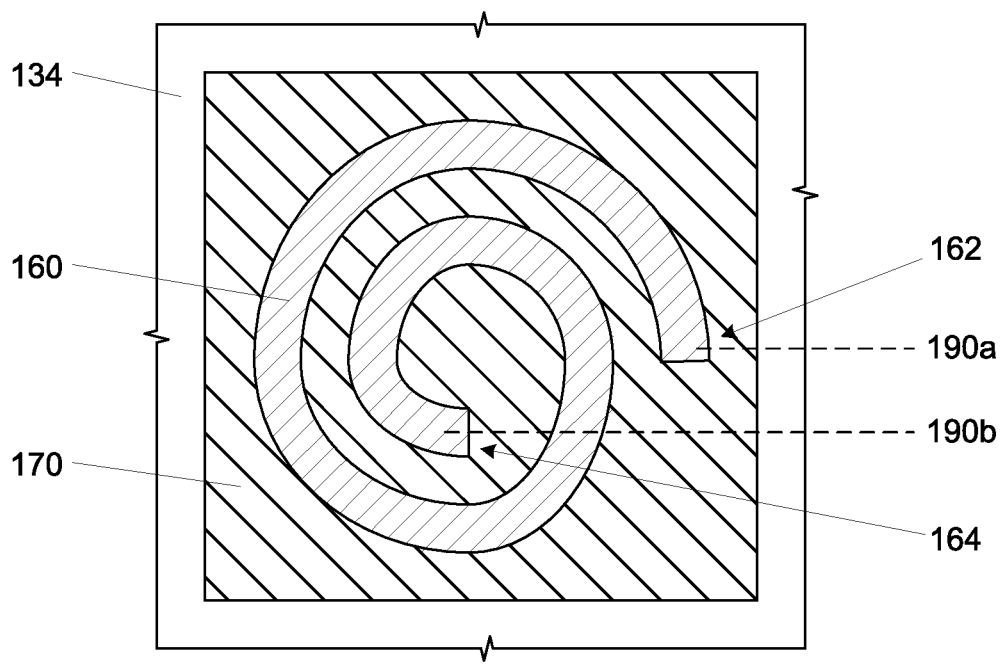
Figure 29:
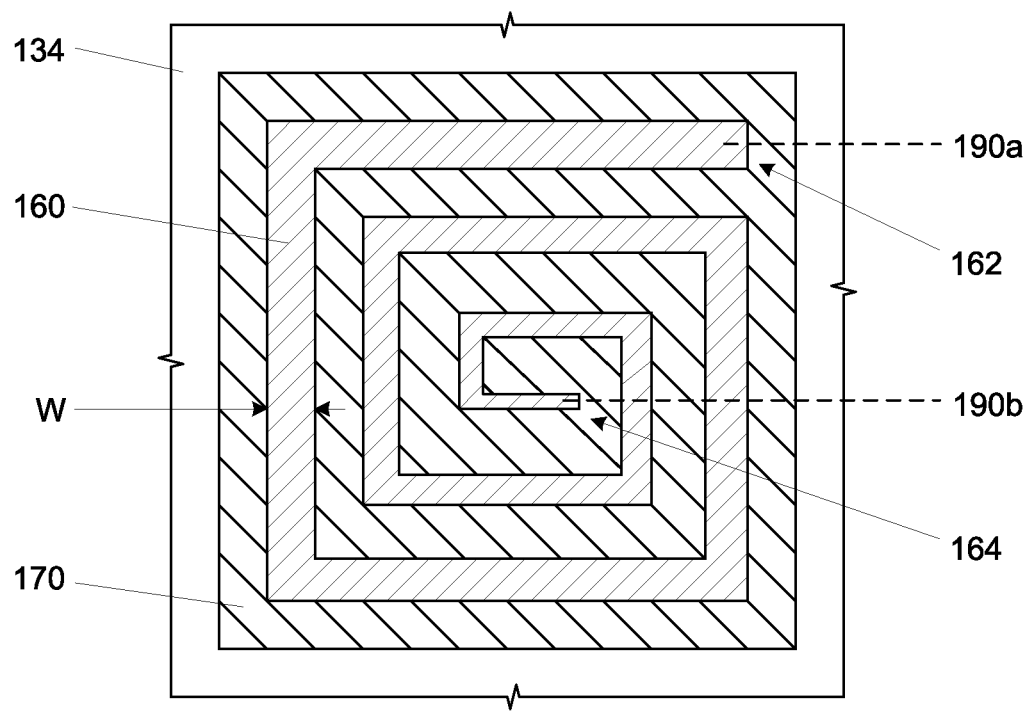

As will further be understood to those skilled in the art, the inductor coil 160 may have any appropriate planar configuration depending on the requirements of the electronic substrate 100. In one embodiment shown in FIG. 27, the inductor coil 160 may comprise a spiraling square. As will be understood to those skilled in the art, a first end 162 of the inductor coil 160 is electrically connected to at least one first conductive route 190a (shown as a dashed line) and a second end 164 of the inductor coil 160 is electrically connected to at least one second conductive route 190b (shown as a dashed line). In another embodiment in FIG. 28, the inductor coil 160 may comprise a circular spiral. It is understood that, in order to achieve specific performance characteristics, the inductor coil 160 can be designed with varying width W and thickness T (see FIG. 2), as shown in FIG. 29, which illustrates a variation in the width W of the inductor coil 160.

Figure 30:
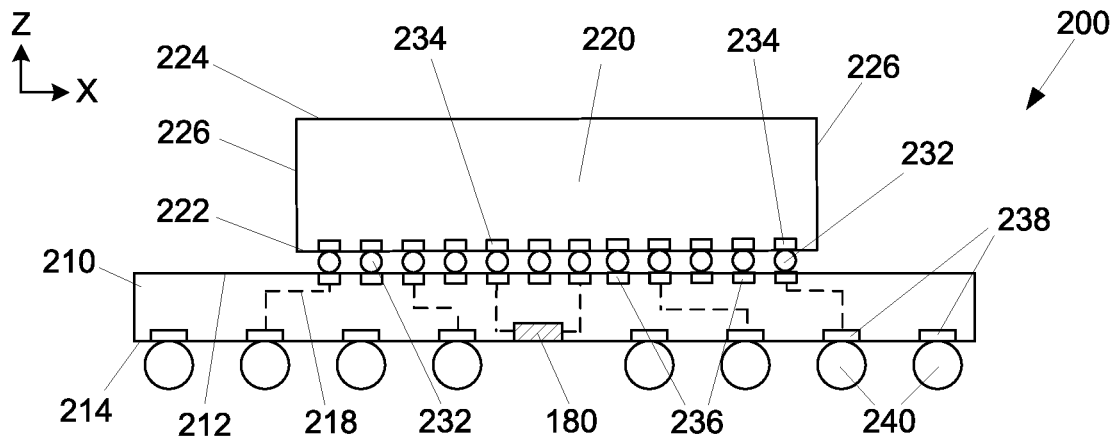
FIG. 30 is a side cross-sectional view of an integrated circuit package having an electronic substrate that contains at least one inductor, according to an embodiment of the present description.

FIG. 30 illustrates an integrated circuit assembly 200 having at least one integrated circuit device 220 electrically attached to an electronic substrate 210 in a configuration generally known as a flip-chip or controlled collapse chip connection ("C4") configuration, according to an embodiment of the present description. The electronic substrate 210 may be the electronic substrate 100 of FIGS. 12 and 24, and/or comprise any of the embodiment of FIGS. 1-29.

The electronic substrate 210 may be any appropriate structure, including, but not limited to, an interposer. The electronic substrate 210 may have a first surface 212 and an opposing second surface 214. The electronic substrate 210 may comprise a plurality of dielectric material layers (such as the first level dielectric material layer 114, the second level dielectric material layer 124, and the third level dielectric material layer 134 of FIGS. 12 and 24), which may include build-up films and/or solder resist layers, and may be composed of an appropriate dielectric material, including, but not limited to, bismaleimide triazine resin, fire retardant grade 4 material, polyimide material, silica filled epoxy material, glass reinforced epoxy material, and the like, as well as low-k and ultra low-k dielectrics (dielectric constants less than about 3.6), including, but not limited to, carbon doped dielectrics, fluorine doped dielectrics, porous dielectrics, organic polymeric dielectrics, and the like.

The electronic substrate 210 may further include conductive routes 218 or "metallization" (shown in dashed lines) extending through the electronic substrate 210. As will be understood to those skilled in the art, the conductive routes 218 may be a combination of conductive traces (such as the first level conductive traces 112, the second level conductive traces 122, and the third level conductive traces 132 of FIGS. 12 and 24) and conductive vias (such as the first level conductive vias 116, the second level conductive vias 124, and the third level conductive vias 136 of FIGS. 12 and 24) extending through the plurality of dielectric material layers (not shown). The electronic substrate 210 may be fabricated in the manner described for the electronic substrate 100 of FIGS. 1-24 and may include at least one inductor 180 of the present description.

The integrated circuit device 220 may be any appropriate device, including, but not limited to, a microprocessor, a chipset, a graphics device, a wireless device, a memory device, an application specific integrated circuit, a transceiver device, an input/output device, combinations thereof, stacks thereof, or the like. As shown in FIG. 30, the integrated circuit device 220 may have a first surface 222, an opposing second surface 224, and at least one side 226 extending between the first surface 222 and the second surface 224. The integrated circuit device 220 may be a monolithic silicon die or plurality of molded composited dice.

In an embodiment of the present description, the first integrated circuit device 220 may be electrically attached to the electronic substrate 210 with a plurality of device-to-substrate interconnects 232 (such as the die-side solder interconnects of FIGS. 12 and 24). In one embodiment of the present description, the device-to-substrate interconnects 232 may extend between bond pads 236 on the first surface 212 of the electronic substrate 210 and bond pads 234 on the first surface 222 of the integrated circuit device 220. The device-to-substrate interconnects 232 may be any appropriate electrically conductive material or structure, including, but not limited to, solder balls, metal bumps or pillars, metal filled epoxies, or a combination thereof. In one embodiment, the device-to-substrate interconnects 232 may be solder balls formed from tin, lead/tin alloys (for example, 63% tin/37% lead solder), and high tin content alloys (e.g., 90% or more tin—such as tin/bismuth, eutectic tin/silver, ternary tin/silver/copper, eutectic tin/copper, and similar alloys). In another embodiment, the device-to-substrate interconnects 232 may be copper bumps or pillars. In a further embodiment, the device-to-substrate interconnects 232 may be metal bumps or pillars coated with a solder material.

The bond pads 234 may be in electrical communication with integrated circuitry (not shown) within the integrated circuit device 220. The bond pads 236 on the first surface 212 of the electronic substrate 210 may be in electrical contact with the conductive routes 218. The conductive routes 218 may extend through the electronic substrate 210 and be connected to bond pads 238 on the second surface 214 of the electronic substrate 210. As will be understood to those skilled in the art, the electronic substrate 210 may reroute a fine pitch (center-to-center distance between the bond pads) of the integrated circuit device bond pads 236 to a relatively wider pitch of the bond pads 238 on the second surface 214 of the electronic substrate 210. In one embodiment of the present description, external interconnects 240 (such as the die-side solder interconnects of FIGS. 12 and 24) may be disposed on the bond pads 238 on the second surface 214 of the electronic substrate 210. The external interconnects 240 may be any appropriate electrically conductive material, including, but not limited to, metal filled epoxies and solders, such as tin, lead/tin alloys (for example, 63% tin/37% lead solder), and high tin content alloys (e.g., 90% or more tin—such as tin/bismuth, eutectic tin/silver, ternary tin/silver/copper, eutectic tin/copper, and similar alloys). The external interconnects 240 may be used to attach the integrated circuit assembly 200 to an external substrate (not shown), such as a motherboard.

Figure 31:
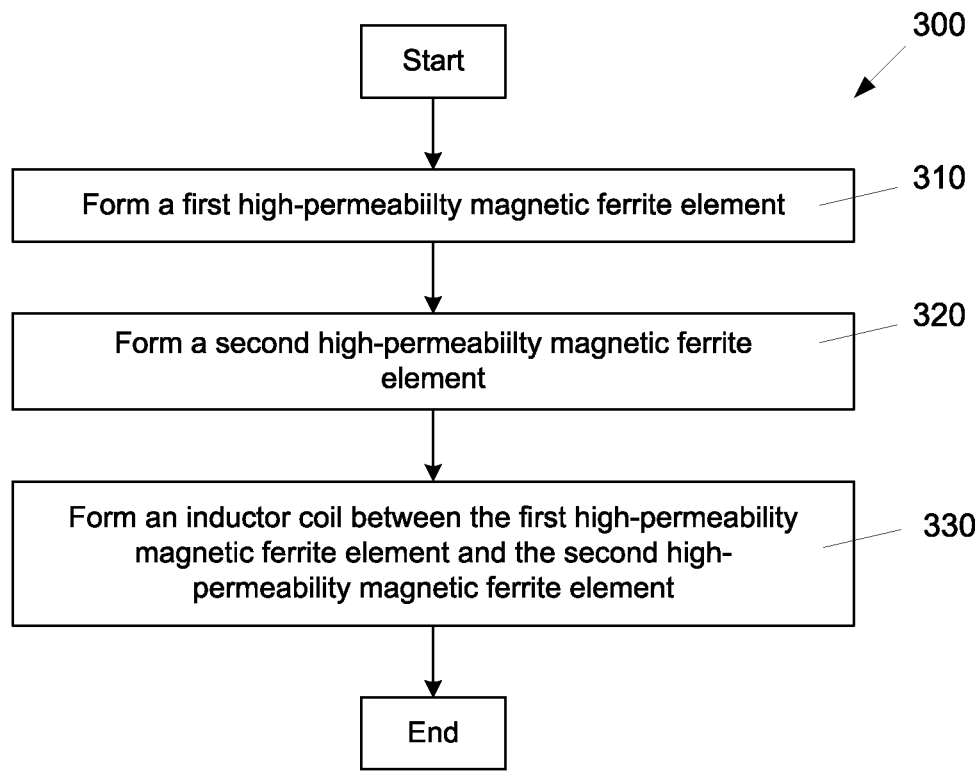
FIG. 31 is a flow diagram of a process for forming an inductor, according to an embodiment of the present description.

FIG. 31 is a flow chart of a process 300 of fabricating an inductor. As set forth in block 310, a first high-permeability magnetic ferrite element may be formed. A second high-permeability ferrite element may be formed, as set forth in block 320. As set forth in block 330, an inductor coil may be formed between the first high-permeability magnetic ferrite element and the second high-permeability magnetic ferrite element, as set forth in block 330.

Figure 32:
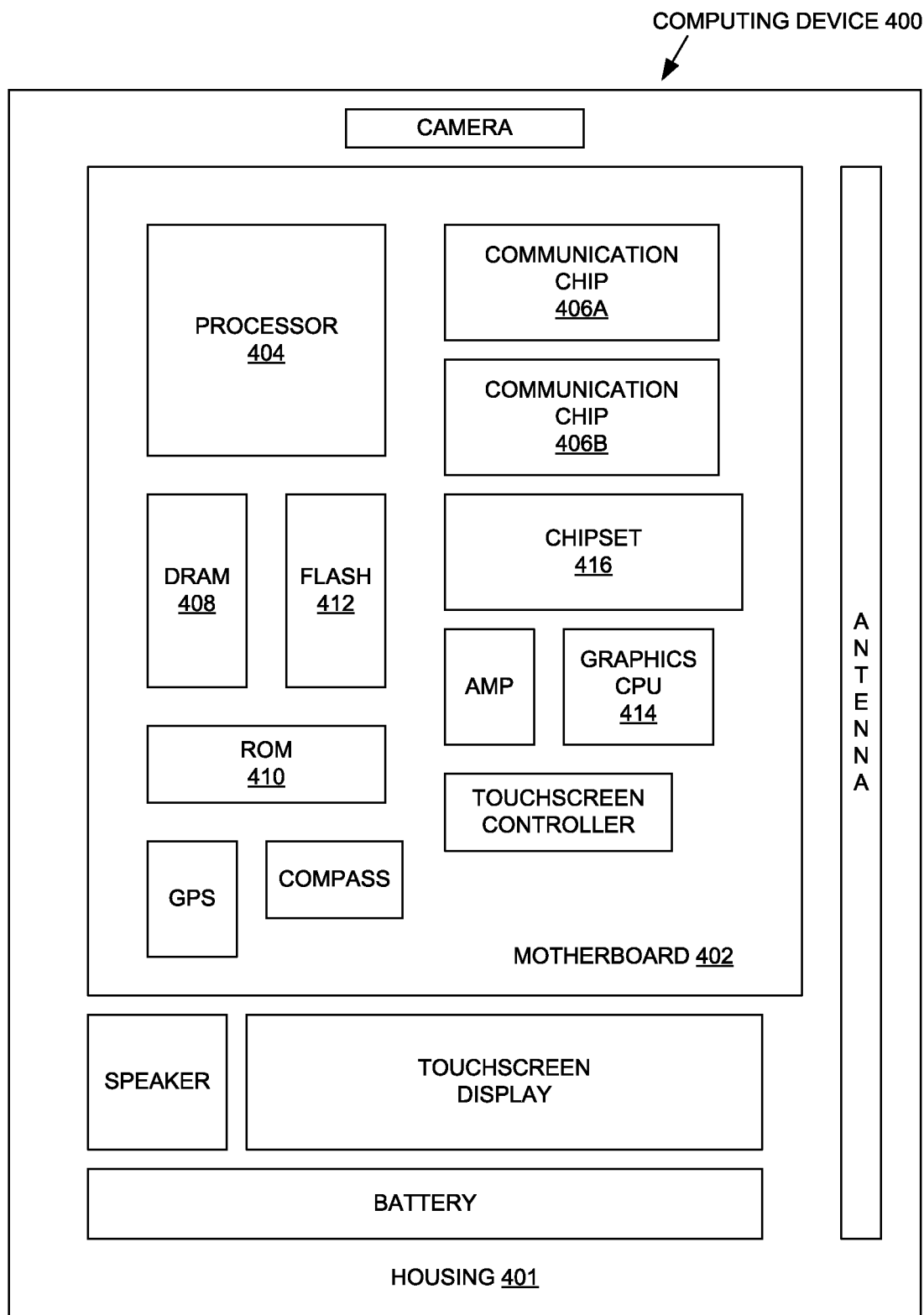
FIG. 32 is an electronic system, according to one embodiment of the present description.

FIG. 32 illustrates an electronic or computing device 400 in accordance with one implementation of the present description. The computing device 400 may include a housing 401 having a board 402 disposed therein. The computing device 400 may include a number of integrated circuit components, including but not limited to a processor 404, at least one communication chip 406A, 406B, volatile memory 408 (e.g., DRAM), non-volatile memory 410 (e.g., ROM), flash memory 412, a graphics processor or CPU 414, a digital signal processor (not shown), a crypto processor (not shown), a chipset 416, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 402. In some implementations, at least one of the integrated circuit components may be a part of the processor 404.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an electronic substrate having an inductor embedded, wherein the inductor may comprise a first magnetic element, a second magnetic element, a dielectric capping layer between the first magnetic element and the second magnetic element, and an inductor coil between the first magnetic element and the second magnetic element.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-32. The subject matter may be applied to other integrated circuit devices and assembly applications, as well as any appropriate electronic application, as will be understood to those skilled in the art.

The following examples pertain to further embodiments and specifics in the examples may be used anywhere in one or more embodiments, wherein Example 1 is an apparatus comprising a first high-permeability magnetic ferrite element, a second high-permeability magnetic ferrite element, and an inductor coil between the first high-permeability magnetic ferrite element and the second high-permeability magnetic ferrite element.

In Example 2, the subject matter of Example 1 can optionally include at least one of the first high-permeability magnetic ferrite element and the second high-permeability magnetic ferrite element being a nickel/zinc ferrite.

In Example 3, the subject matter of Example 1 can optionally include at least one of the first high-permeability magnetic ferrite element and the second high-permeability magnetic ferrite element being a nickel/zinc/cobalt ferrite.

In Example 4, the subject matter of any of Examples 1 to 3 can optionally include the inductor coil comprising a first surface, an opposing second surface, and at least one side extending between the first surface and the second surface, wherein a width of the first surface is greater than a width of the second surface.

In Example 5, the subject matter of any of Examples 1 to 4 can optionally include a frame structure, wherein the first high-permeability magnetic ferrite element abuts the frame structure.

In Example 6, the subject matter of any of Examples 1 to 5 can optionally include the inductor coil being at least partially embedded in the first high-permeability magnetic ferrite element.

In Example 7, the subject matter of any of Examples 1 to 6 can optionally include the inductor coil being substantially encapsulated by the first high-permeability magnetic ferrite element and the second high-permeability magnetic ferrite element.

Example 8 is an apparatus comprising an electronic substrate, wherein the electronic substrate includes at least one dielectric material layer and at least one inductor at least partially embedded in the at least one dielectric material layer, and wherein the at least one inductor comprises a first a first high-permeability magnetic ferrite element, a second high-permeability magnetic ferrite element, and an inductor coil between the first high-permeability magnetic ferrite element and the second high-permeability magnetic ferrite element.

In Example 9, the subject matter of Example 8 can optionally include at least one of the first high-permeability magnetic ferrite element and the second high-permeability magnetic ferrite element being a nickel/zinc ferrite.

In Example 10, the subject matter of Example 8 can optionally include at least one of the first high-permeability magnetic ferrite element and the second high-permeability magnetic ferrite element being a nickel/zinc/cobalt ferrite.

In Example 11, the subject matter of any of Examples 8 to 10 can optionally include the inductor coil comprising a first surface, an opposing second surface, and at least one side extending between the first surface and the second surface, wherein a width of the first surface is greater than a width of the second surface.

In Example 12, the subject matter of any of Examples 8 to 11 can optionally include a frame structure, wherein the first high-permeability magnetic ferrite element abuts the frame structure.

In Example 13, the subject matter of any of Examples 8 to 12 can optionally include a frame structure, wherein the first high-permeability magnetic ferrite element abuts the frame structure.

In Example 14, the subject matter of Example 13 can optionally include the inductor coil being electrically attached to at least two conductive routes of the plurality of conductive routes.

Example 15 is a system comprising an electronic board; and an integrated circuit package electrically attached to the electronic board, wherein the integrated circuit package comprises an electronic substrate having an inductor therein, wherein the inductor comprises a first high-permeability magnetic ferrite element, a second high-permeability magnetic ferrite element, and an inductor coil between the first high-permeability magnetic ferrite element and the second high-permeability magnetic ferrite element; and at least one integrated circuit die, wherein the at least one integrated circuit die is electrically attached to the package substrate.

In Example 16, the subject matter of Example 15 can optionally include at least one of the first high-permeability magnetic ferrite element and the second high-permeability magnetic ferrite element being a nickel/zinc ferrite.

In Example 17, the subject matter of Example 15 can optionally include at least one of the first high-permeability magnetic ferrite element and the second high-permeability magnetic ferrite element being a nickel/zinc/cobalt ferrite.

In Example 18, the subject matter of any of Examples 15 to 17 can optionally include the inductor coil comprising a first surface, an opposing second surface, and at least one side extending between the first surface and the second surface, wherein a width of the first surface is greater than a width of the second surface.

In Example 19, the subject matter of any of Examples 15 to 18 can optionally include a frame structure, wherein the first high-permeability magnetic ferrite element abuts the frame structure.

In Example 20, the subject matter of any of Examples 15 to 19 can optionally include the inductor coil being at least partially embedded in the first high-permeability magnetic ferrite element.

In Example 21, the subject matter of any of Examples 15 to 20 can optionally include the inductor coil being substantially encapsulated by the first high-permeability magnetic ferrite element and the second high-permeability magnetic ferrite element.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An apparatus, comprising:
   a plurality of metallization levels with one or more layers of dielectric material between the levels, wherein each of the metallization levels comprises a plurality of coplanar metallization traces;
   a first high-permeability magnetic ferrite element within the dielectric material, the first high-permeability magnetic ferrite element in direct contact with a first surface of a coiled one of the metallization traces in a first of the metallization levels; and a second high-permeability magnetic ferrite element within the dielectric material, the second high-permeability magnetic ferrite element in direct contact with a second surface of the coiled one of the metallization traces, opposite the first surface, and in direct contact with a portion of the first high-permeability magnetic ferrite element extending between turns of the coiled one of the metallization traces.

2. The apparatus of claim 1, wherein at least one of the first high-permeability magnetic ferrite element and the second high-permeability magnetic ferrite element comprises a nickel/zinc ferrite.

3. The apparatus of claim 1, wherein at least one of the first high-permeability magnetic ferrite element and the second high-permeability magnetic ferrite element comprises a nickel/zinc/cobalt ferrite.

4. The apparatus of claim 1, wherein a profile of the coiled one of the metallization traces has a side with an angle of between 45 and 80 degrees from a plane of the first of the metallization levels, and wherein a width of the first surface of the coiled one of the metallization traces is greater than a width of the second surface of the coiled one of the metallization traces.

5. The apparatus of claim 1, wherein the first of the metallization levels further comprises a second metallization trace adjacent to the coiled one of the metallization traces, wherein a first surface of the second metallization trace is coplanar with the first surface of the coiled one of the traces and a second surface of the second metallization trace is coplanar with the second surface of the coiled one of the traces, and wherein the first high-permeability magnetic ferrite element is in direct contact with only a partial width of the second surface of the second metallization trace.

6. The apparatus of claim 1, wherein coiled one of the metallization traces comprises at least one full turn that occupies a first area smaller than a second area occupied by the first high-permeability magnetic ferrite element.

7. The apparatus of claim 6, wherein the second high-permeability magnetic ferrite element occupies an area larger than the first area.

8. An apparatus, comprising:
a coreless electronic substrate, wherein the coreless electronic substrate comprises a planar inductor coil between a first dielectric material layer and a second dielectric material layer, and wherein:
  a first high-permeability magnetic ferrite element is between, and in contact with, both the first dielectric material layer and the inductor coil; and
  a second high-permeability magnetic ferrite element is between, and in contact with, both the second dielectric material layer and the inductor coil, and is in direct contact with a portion of the first high-permeability magnetic ferrite element between turns of the inductor coil.

9. The apparatus of claim 8, wherein at least one of the first high-permeability magnetic ferrite element and the second high-permeability magnetic ferrite element comprises a nickel/zinc ferrite.

10. The apparatus of claim 8, wherein at least one of the first high-permeability magnetic ferrite element and the second high-permeability magnetic ferrite element comprises a nickel/zinc/cobalt ferrite.

11. The apparatus of claim 8, wherein the inductor coil comprises a coiled trace having a first surface, an opposing second surface, and at least one side extending between the first surface and the second surface at an angle of between 45 and 80 degrees from a plane of the inductor coil, wherein a width of the first surface is greater than a width of the second surface.

12. The apparatus of claim 8, further including a frame structure comprising a second trace adjacent to the coiled trace, wherein the first high-permeability magnetic ferrite element abuts a first side of the second trace proximal to the coiled trace, and the first high-permeability magnetic ferrite element is absent from a second, opposite, side of the second trace.

13. The apparatus of claim 8, wherein the coreless electronic substrate further comprises a plurality of conductive routes within a plurality of dielectric material layers.

14. The apparatus of claim 13, wherein the inductor coil is electrically attached to at least two conductive routes of the plurality of conductive routes.

15. A system, comprising:
an electronic board; and
an integrated circuit package electrically attached to the electronic board, wherein the integrated circuit package, comprises the electronic substrate of claim 8; and
  at least one integrated circuit die, wherein the at least one integrated circuit die is electrically attached to the package substrate.

16. The system of claim 15, wherein at least one of the first high-permeability magnetic ferrite element and the second high-permeability magnetic ferrite element each have a permeability of at least 120 over a frequency range of a magnetic field of between about 50 to 120 megahertz.

17. The system of claim 16, wherein at least one of the first high-permeability magnetic ferrite element and the second high-permeability magnetic ferrite element comprises a nickel/zinc/cobalt ferrite.

18. The system of claim 15, further comprising a solder interconnect coplanar with one of the first or second high-permeability magnetic ferrite elements.

19. The system of claim 18, wherein the solder interconnect is on a land-side of the coreless electronic substrate.

20. The system of claim 18, wherein one of the first or second high-permeability magnetic ferrite elements is in direct contact with a solder resist.

21. The system of claim 15, wherein the inductor coil comprises a rectilinear or curved spiraling trace.

* * * * *